(12) United States Patent
Mori

(10) Patent No.: US 6,337,734 B1
(45) Date of Patent: Jan. 8, 2002

(54) EXPOSURE CONTROL METHOD, EXPOSURE APPARATUS AND DEVICE MANUFACTURING METHOD

(75) Inventor: Kenichiro Mori, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/538,299

(22) Filed: Mar. 30, 2000

(30) Foreign Application Priority Data

Apr. 1, 1999 (JP) .......................................... 11-095457

(51) Int. Cl.[7] ........................... G03B 27/72; G03B 27/42
(52) U.S. Cl. ............................... 355/69; 355/53; 355/71
(58) Field of Search ............................... 355/53, 67–71, 355/77; 356/399–401; 250/492.2, 205

(56) References Cited

U.S. PATENT DOCUMENTS 5,831,716 A * 11/1998 Tanimoto ..................... 355/68
5,883,701 A * 3/1999 Hasegawa et al. ............. 355/53
6,163,365 A * 12/2000 Takahashi ..................... 355/53

* cited by examiner

Primary Examiner—Russell Adams
Assistant Examiner—Henry Hung Nguyen
(74) Attorney, Agent, or Firm—Fitzpatrick, Cella, Harper & Scinto

(57) ABSTRACT

When a pattern on a reticle (8) is illuminated by illuminating light from a light source (1) so as to be projected onto a substrate (11) to expose the same, the illuminating light is diverted by a half-mirror (13), the amount of exposure is measured on the optical path of the diverted illuminating light and the amount of exposure of the substrate is controlled based upon the result of such measurement. The position of the half-mirror (13) is set in such a manner that the optical path of the diverted illuminating light passes through part of an optical element (5) situated on a side of the half-mirror (13) that faces the light source (1), and the amount of exposure is measured on the optical path of the diverted illuminating light following its passage through the optical element. This makes it possible to reduce the space for exposure measurement that is necessary to control the amount of exposure.

6 Claims, 11 Drawing Sheets

EXPOSURE CONTROL METHOD, EXPOSURE APPARATUS AND DEVICE MANUFACTURING METHOD

FIELD OF THE INVENTION

This invention relates to an exposure control method for controlling the amount of exposure of a photosensitive substrate in an exposure apparatus used in a lithographic process for manufacturing, e.g., a semiconductor element, a liquid crystal element, an image sensing device (CCD, etc.) or a thin-film magnetic head, as well as to an exposure apparatus and device manufacturing method capable of employing this control method. The present invention is applicable not only to a batch exposure type exposure apparatus but also in a case where the amount of exposure is controlled in a step-and-scan scanning exposure type projection exposure apparatus in which part of the pattern on a mask (reticle) is projected onto a photosensitive substrate and the mask and substrate are then scanned synchronously with respect to a projection opticals unit, whereby the mask pattern is transferred to shot areas on the substrate to expose these areas to the mask pattern.

BACKGROUND OF THE INVENTION

FIG. 2 illustrates a projection exposure apparatus according to the prior art. The apparatus includes a light source 1 such as a high-voltage mercury-vapor lamp which emits illuminating light. The light from the light source 1 is condensed to a point by a condensing mirror 2 and impinges upon a fly-eye lens 4 through an opticals unit 3. There are instances where a laser or the like may be used as the source of illuminating light, in which case the condensing mirror 2 is unnecessary and the light from the laser need only impinge upon the fly-eye lens 4 through the opticals unit 3.

The fly-eye lens 4 is a bundle of rod lenses the entrance and exit surfaces of which have their focal points on each other's surface. A group of light beams that impinge upon the rod lenses at an identical angle are condensed at the exit surfaces and form a number of points of condensed light on the exit surface of the fly-eye lens.

Utilizing the group of condensed points of light formed on the exit surface of the fly-eye lens 4, the opticals unit 5 uniformly illuminates the position of a diaphragm 6, which controls an illuminated area at a position that is conjugate with the plane of a mask 8. An opticals unit 7 is for forming the image of the position of the uniformly illuminated diaphragm 6 on the mask surface 8. Uniform illumination of the mask surface 8 is achieved by forming the image of the position of the uniformly illuminated diaphragm 6 on the mask surface 8. It should be noted that the position of mask 8, the position of diaphragm 6 and the entrance surface of the fly-eye lens 4 are located at conjugate points.

The apparatus further includes a projection opticals unit 9 for forming the image of the pattern of mask 8 on a substrate 11. A photosensitive agent that has been applied to the substrate 11 is exposed to the mask pattern by the illuminating light from the illuminating opticals unit. The projection opticals unit 9 is a telecentric unit in which projection magnification does not change even if the position of the mask 8 or the position of the substrate 11 shifts along the optical axis. The arrangement is such that a principal ray which passes through the center of the projection unit at the position of a diaphragm 10 perpendicularly intersects the surface of the mask 8 and the substrate 11.

It should be noted that the diaphragm 10 of the projection opticals unit 9 and the exit surface of the fly-eye lens 4 are located at conjugate points.

The apparatus further includes a movable stage 12 on which the substrate 11 and an exposure sensor 15 are mounted. The exposure sensor 15 can be moved over the illuminated area when the amount of exposure at a position identical with that of the substrate 11 is measured with stepping movement for exposing a plurality of shots on the substrate 11.

In such a projection exposure apparatus used in the manufacture of semiconductor devices and the like, it is required that the substrate be subjected to a proper amount of exposure, which depends upon the photosensitive agent that has been applied to the substrate and the pattern possessed by the mask 8, in order that the mask pattern will be transferred to the substrate in optimum fashion. If the amount of exposure is less than the proper amount in a case where a positive pattern and a negative resist are used, for example, the photosensitive agent will not be sensitized sufficiently and the lines of the pattern may become too fine and be rendered discontinuous at points. If the amount of exposure is too large, on the other hand, the photosensitive agent will be sensitized excessively and the lines of the pattern may become so thick that neighboring lines will contact each other. Further, if the amount of exposure is less than the proper amount in a case where a negative pattern and a positive resist are used, the photosensitive agent will not be sensitized sufficiently and the lines of the pattern may become so thick that neighboring lines will contact each other. If the amount of exposure is too large, on the other hand, the photosensitive agent will be sensitized excessively and the lines of the pattern may become too fine and be rendered discontinuous at points. In any case, when exposure is carried out with an improper amount of exposure, a suitable pattern cannot be formed on the substrate. This invites a decline in yield when semiconductor devices or the like are manufactured.

Control of the amount of exposure to which the substrate 11 is subjected must be controlled in order to obtain the proper amount of exposure. However, the amount of exposure being applied to the substrate 11 cannot be measured directly during the transfer of the pattern of mask 8 to the substrate 11. If the amount of exposure is measured along the optical path of the exposing light, the shadow of the exposure sensor has an influence when the mask pattern is transferred to the substrate 11. For this reason, the amount of exposure is controlled upon measuring the amount of exposure at a position which is at a conjugate point with the substrate 11 and offset from the optical path of the exposing light.

Use is made of a half-mirror 13, which has a very low reflectivity, inserted into the optical path of the exposing light in order to produce a position which is at a conjugate point with respect to the substrate 11 and offset from the optical path of the exposing light. That is, the half-mirror 13 produces a position which is at a point conjugate with the substrate 11 and offset from the optical path of the exposing light at the position of an exposure sensor 14. The sensor 14 is placed directly in front of the point conjugate with the substrate 11 and at an inclination relative to the optical axis of the exposing light for the purpose of measuring the amount of exposure from the light diverted to it by the half-mirror 13.

The exposure sensor 14 is so adapted as to be capable of measuring an amount of exposure that corresponds to the amount of exposure exactly at the center of the illuminated area, namely at the position of the substrate 11 on the optical axis. Before the substrate 11 is exposed, the exposure sensor 15 mounted on the stage 12 is moved to the center of the illuminated zone, trial exposure is carried out and the relationship between the amount of exposure at the position measured by the exposure sensor 14 and the amount of exposure on the substrate 11 is found, thereby making it possible to estimate the amount of exposure on the substrate 11 from the output of the exposure sensor 14.

A controller 16 is for controlling the amount of exposure. On the basis of the output of the exposure sensor 14, and in accordance with a predetermined control program, the controller 16 controls the amount of exposure by controlling the opening and closing of a shutter 17, the transmittance of beam attenuating means 18 the transmittance of which is variable, and the input to the light source 1.

Assume that the half-mirror is used in the opticals unit. As may readily be deduced from the laws of opticals, a difference in reflectivity ascribed to the state of polarization of a ray of light increases with an increase in the angle formed by the ray of light and the perpendicular to the half-mirror. As a consequence, the intensity of light in back of the mirror differs depending upon the state of polarization of the light. This influences the degree of illuminance unevenness in the illuminated area. In order to illuminate the illuminated area uniformly, therefore, it is required that the half-mirror be disposed so as to perpendicularly intersect the optical axis to the greatest extent possible.

In accordance with the prior art of FIG. 2, however, a ray of light reflected by the half-mirror 13 reaches the exposure sensor 14 directly. Consequently, as shown in FIG. 2, the half-mirror 13 must disposed in such a manner that a ray of light reflected from the half-mirror 13 to the exposure sensor 14 will not be obstructed by the lens 5 immediately in front of the half-mirror 13.

FIG. 4 illustrates light rays which arrive at the lens 5 immediately in front of the half-mirror 13 and at the illuminated area along the optical axis in the vicinity of the half-mirror 13 in the example of the prior art shown in FIG. 2. In order to arrange it so that the light reflected from the half-mirror 13 to the exposure sensor 14 will not be obstructed by the lens immediately in front of the half-mirror 13, the relation $B<A\tan\theta$ should hold, where A represents the distance from the lens 5 to the half-mirror 13, B the radius of the lens 5 and $\theta$ the angle defined by the perpendicular to the half-mirror 13 and the optical axis. Making the half-mirror 13 nearly perpendicular to the optical axis in order to reduce the difference in reflectivity due to the state of polarization corresponds to reducing the angle $\theta$ formed by the reflected light ray and optical axis. In the example of the prior art, therefore, the distance A between the half-mirror 13 and the lens 5 is great.

In other words, in the example of the prior art, if it is attempted to insert the half-mirror 13 into the optical path so as to diminish the difference in intensity of light between one state of polarization and another in back of the half-mirror 13, the distance between the half-mirror 13 and the lens 5 becomes too large, thereby making necessary a large amount of space in order to be able to control the amount of exposure of substrate 11. However, as a result of the improved performance and capabilities sought for projection exposure apparatus, the opticals unit employed in such apparatus has become extremely complicated and there is a tendency for such apparatus to be of ever increasing size.

Accordingly, in order to reduce the size of a projection exposure apparatus even marginally, there is strong demand to reduce the space necessary for controlling the amount of exposure.

SUMMARY OF THE INVENTION

The present invention has been proposed to solve the problems of the prior art and its object is to provide an exposure control method, exposure apparatus and device manufacturing method in which it is possible to reduce the space necessary for measuring the amount of exposure for the purpose of controlling the same.

According to the present invention, the foregoing object is attained by providing a method of controlling amount of exposure in which when a pattern on a reticle is illuminated by illuminating light from a light source so as to be projected onto a substrate to expose the same, the illuminating light is diverted by a half-mirror, the amount of exposure is measured on the optical path of the diverted illuminating light and the amount of exposure of the substrate is controlled based upon result of such measurement, wherein the position of the half-mirror is set in such a manner that the optical path of the diverted illuminating light passes through part of an optical element situated on a side of the half-mirror that faces the light source, and the amount of exposure is measured on the optical path of the diverted illuminating light following its passage through the optical element.

In accordance with a preferred embodiment of the present invention, the method includes a step of performing control of the amount of exposure of the substrate while taking into account a relationship, which has been found in advance, between a measured value of amount of exposure on the optical path of the diverted illuminating light and the amount of exposure of the substrate.

In accordance with a preferred embodiment of the present invention, the method includes steps of finding a relationship between an amount of exposure on the optical path of the diverted illuminating light and amount of exposure of the substrate at a predetermined position on the substrate before the substrate is exposed, and performing control of the amount of exposure of the substrate while taking into account this relationship and unevenness in illuminance in an illuminated area on the substrate when the substrate is exposed.

Further, according to the present invention, the foregoing object is attained by providing an exposure apparatus comprising: projection exposure means for illuminating a pattern on a reticle by illuminating light from a light source so as to project the pattern onto a substrate to expose the same; exposure measurement means for measuring amount of exposure on an optical path to which the illuminating light has been diverted by a half-mirror; and exposure control means for controlling amount of exposure of the substrate based upon result of such measurement, wherein the position of the half-mirror is set in such a manner that the optical path of the diverted illuminating light passes through part of an optical element situated on a side of the half-mirror that faces the light source, and the exposure measurement means measures the amount of exposure on the optical path of the diverted illuminating light following its passage through the optical element; and the exposure control means finds a relationship between an amount of exposure on the optical path of the diverted illuminating light and amount of exposure of the substrate at a predetermined position on the substrate before the substrate is exposed, and performs control of the amount of exposure of the substrate while taking into account this relationship and unevenness in illuminance in an illuminated area on the substrate when the substrate is exposed.

In accordance with a preferred embodiment of the present invention, the projection exposure means is scanning-type projection exposure means which, while part of the reticle pattern is being projected onto the substrate, scans the reticle and the substrate synchronously to thereby scanningly project the reticle pattern onto the substrate.

Further, according to the present invention, the foregoing object is attained by a device manufacturing method for manufacturing a device by illuminating a pattern on a reticle by illuminating light so as to project the pattern onto a substrate to expose the same, wherein when exposure by projection of the illuminating light is performed, the illuminating light is diverted by a half-mirror, the amount of exposure is measured on the optical path of the diverted illuminating light and the amount of exposure of the substrate is controlled based upon result of measurement, the method comprising steps of setting the position of the half-mirror in such a manner that the optical path of the diverted illuminating light passes through part of an optical element situated on a side of the half-mirror that faces the light source and measuring the amount of exposure on the optical path of the diverted illuminating light following its passage through the optical element; and finding a relationship between an amount of exposure on the optical path of the diverted illuminating light and amount of exposure of the substrate at a predetermined position on the substrate before the substrate is exposed, and performing control of the amount of exposure of the substrate while taking into account this relationship and unevenness in illuminance in an illuminated area on the substrate when the substrate is exposed.

In the prior art, the angle of the half-mirror and the distance between the half-mirror and the lens are designed in such a manner that the optical path of the light diverted by the half-mirror will not strike the lens located immediately in front of the half-mirror, and the amount of exposure is measured upon guiding the light from the half-mirror directly to an exposure sensor. As a consequence, a large space is required to measure the amount of exposure. In accordance with the present invention, however, the amount of exposure is measured by guiding the optical path of the light, which has been diverted by the half-mirror, to the exposure sensor after the diverted light has passed through part of an optical element such as a lens situated on the light-source side of the half-mirror. As a result, less space is needed to measure the amount of exposure.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Preferred embodiments of the present invention will now be described in detail in accordance with the accompanying drawings.

Figure 1:
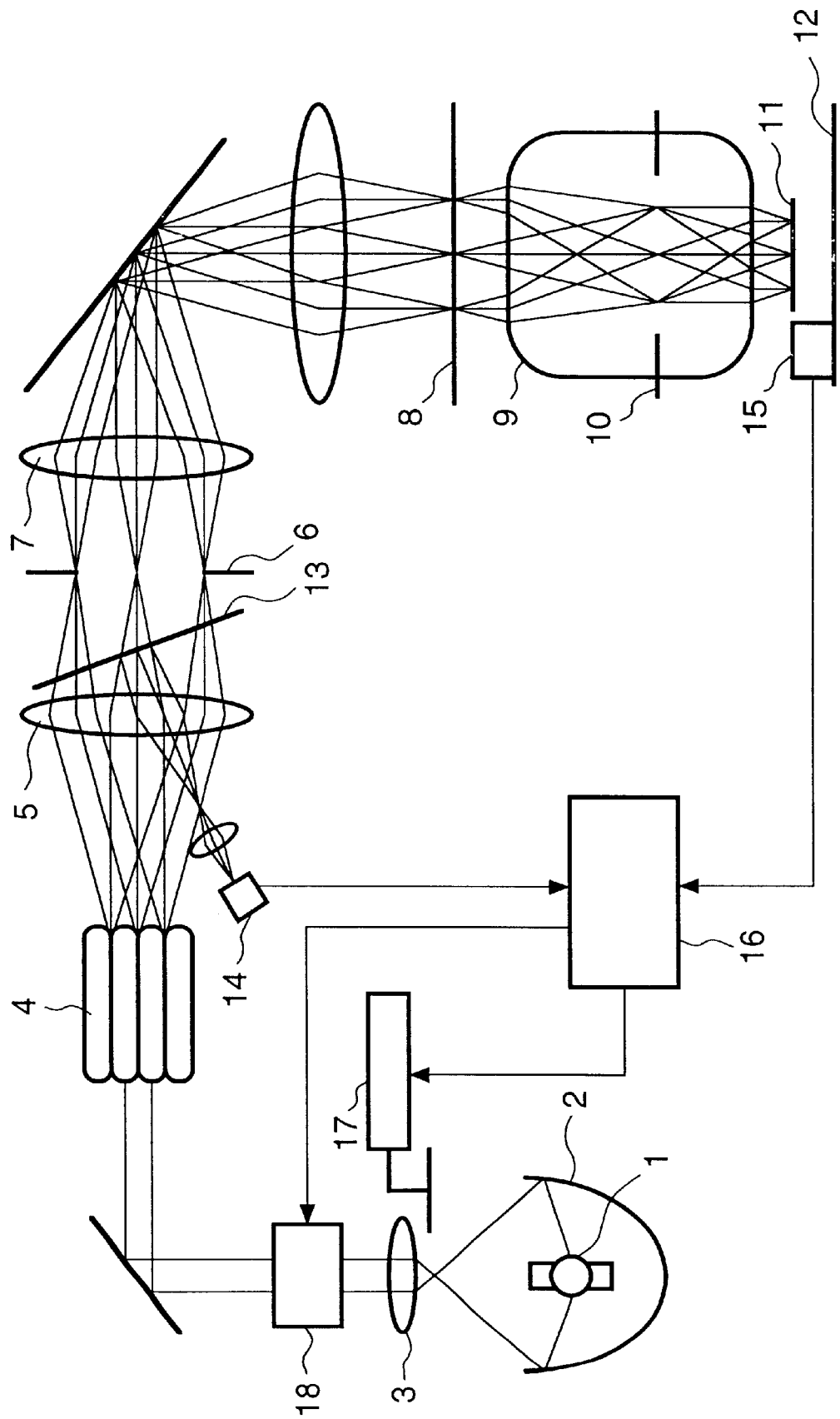
FIG. 1 is a diagram illustrating an exposure apparatus according to a first embodiment of the present invention.
Figure 2:
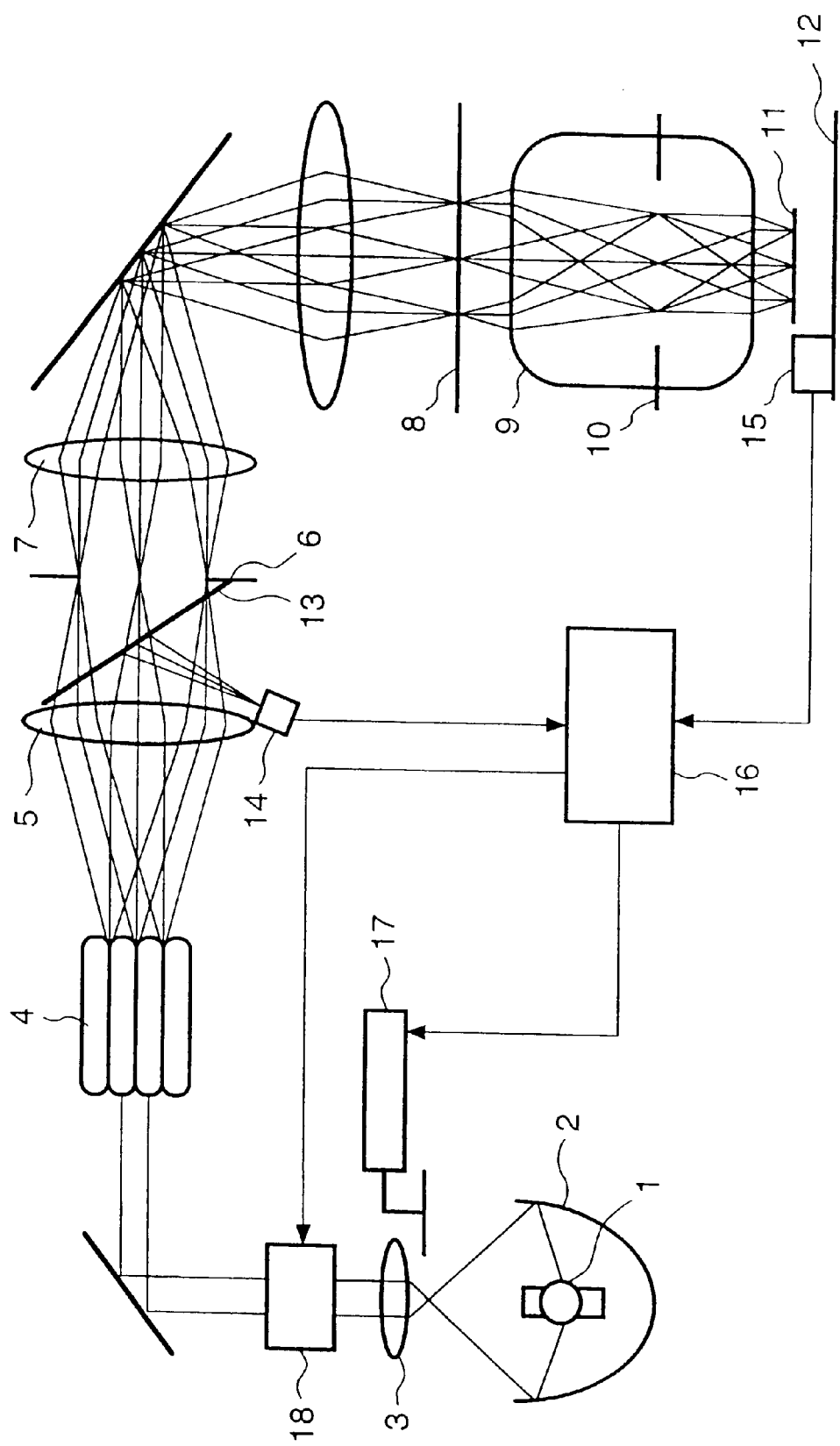
FIG. 2 is a diagram illustrating a projection exposure apparatus according to an example of the prior art.

FIG. 1 illustrates an exposure apparatus according to a first embodiment of the present invention. Components in FIG. 1 identical with those shown in FIG. 2 are designated by like reference characters. In this exposure apparatus also the amount of exposure of the substrate 11 is controlled by controlling the opening and closing of the shutter 17, the transmittance of the beam attenuating means 18 the transmittance of which is variable and the input to the light source 1 based upon the output of the exposure sensor 14 and in accordance with a predetermined control program. This embodiment differs from the prior-art example of FIG. 2 in the optical path along which the light reflected by the half-mirror 13 reaches the exposure sensor 14. More specifically, in the prior art shown in FIG. 2, the light reflected by the half-mirror 13 is measured directly by the exposure sensor 14. By contrast, in accordance with this embodiment, the light reflected by the half-mirror 13 is measured after passing through part of the opticals unit on that side of the half-mirror 13 facing the light source 1.

Figure 3:
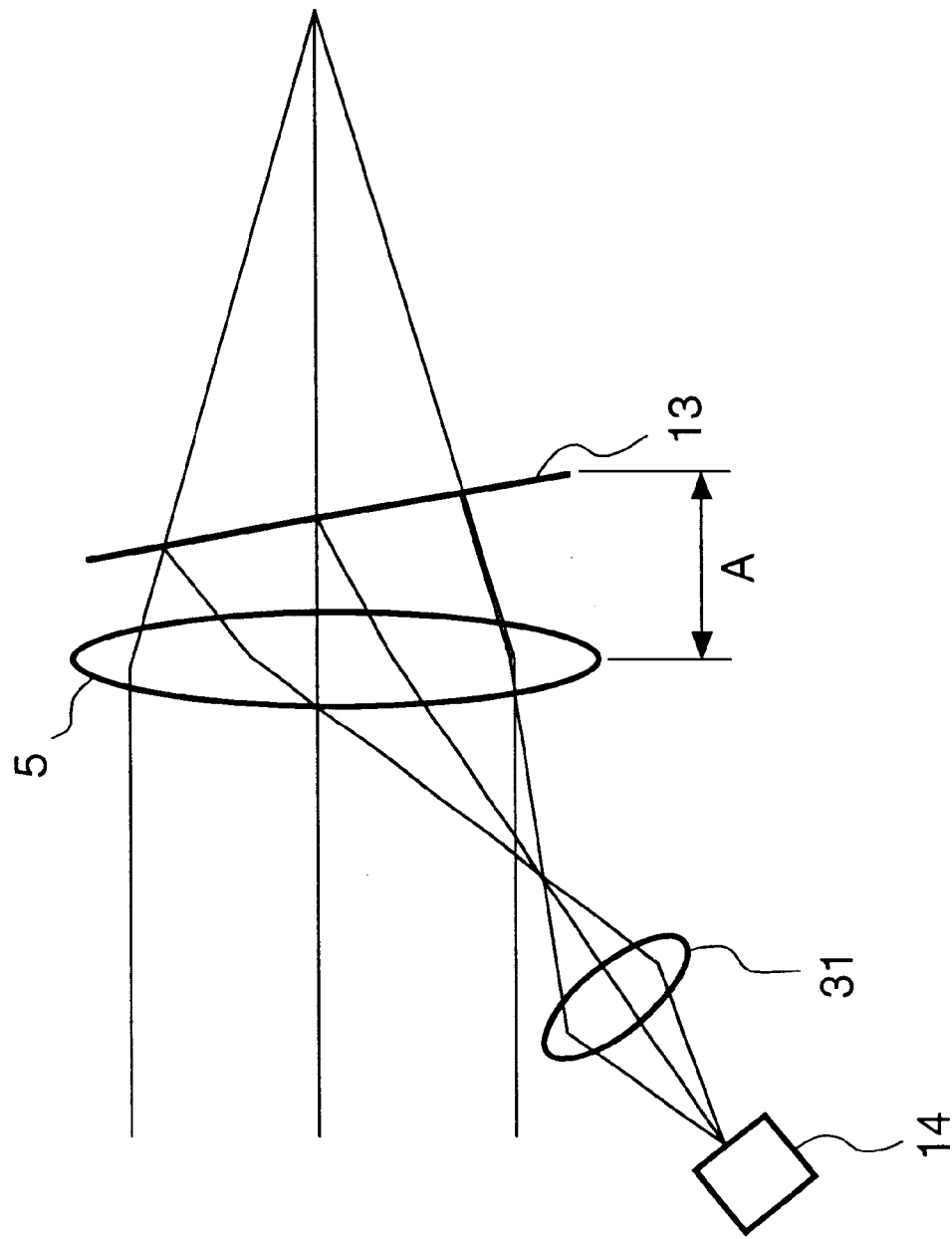
FIG. 3 is a diagram illustrating the proximity of a half-mirror and a lens directly in front thereof in the apparatus of FIG. 1.
Figure 4:
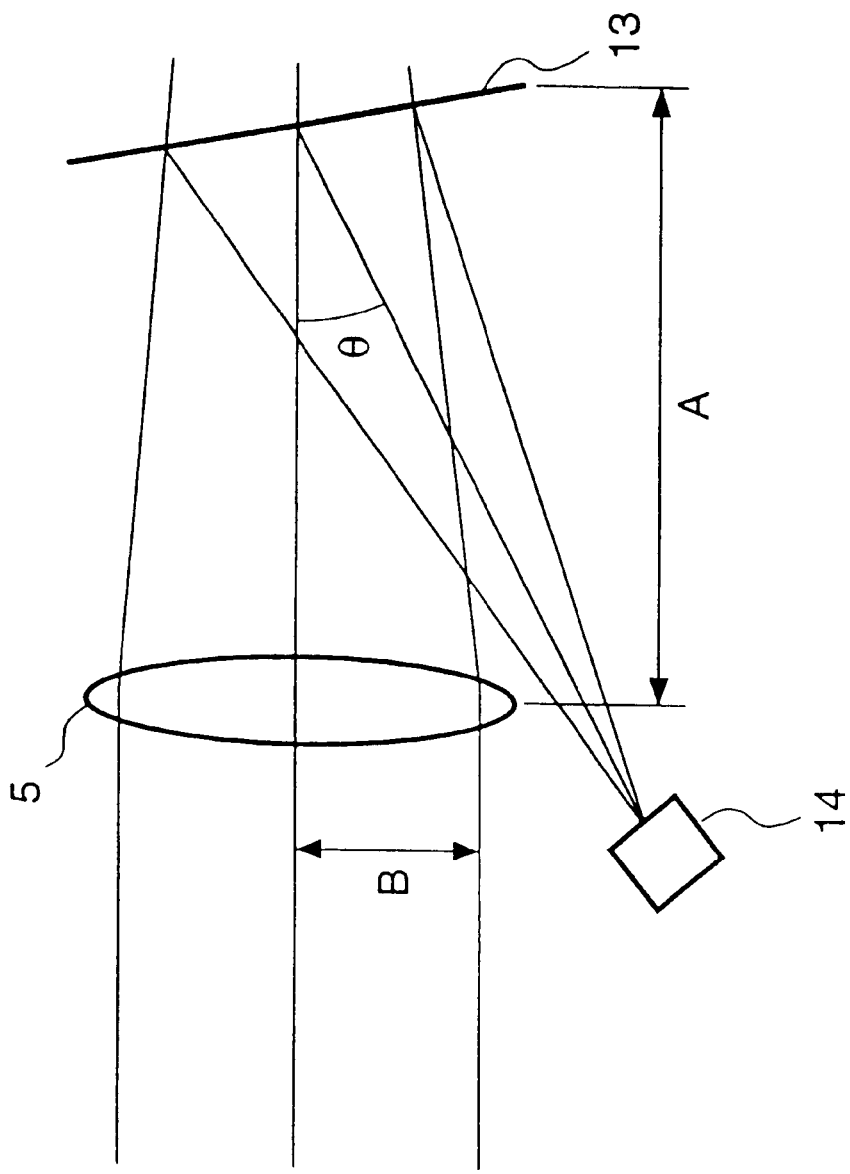
FIG. 4 is a diagram illustrating the proximity of a half-mirror and a lens directly in front thereof in the apparatus of FIG. 2.

In accordance with this embodiment, the space necessary to measure the amount of exposure can be reduced. The reason for this will be described with reference to FIGS. 3 and 4. These drawings illustrate light rays from the lens 5 directly in front of the half-mirror 13 to the diaphragm 6 which controls the illuminated area in accordance with this embodiment. FIG. 4 illustrates light rays which arrive at the lens 5 immediately in front of the half-mirror 13 and at the illuminated area along the optical axis in the vicinity of the half-mirror 13 in the example of the prior art shown in FIG. 2. FIG. 3 illustrates light rays which arrive at the lens 5 immediately in front of the half-mirror 13 and at the illuminated area along the optical axis in the vicinity of the half-mirror 13 according to this embodiment. The inclination of the half-mirror 13 in FIG. 4 is the same as that in FIG. 3. In the prior art, as depicted in FIG. 4, it is required that the distance A between the half-mirror 13 and the lens 5 immediately in front of the half-mirror 13 be made sufficiently large in order that the light reflected by the half-mirror 13 will not be obstructed by the lens 5 so that the light can reach the exposure sensor 14 directly. By contrast, in accordance with this embodiment, the distance A between the half-mirror 13 and the lens 5 can be reduced because it is so arranged that the light reflected by the half-mirror 13 reaches the exposure sensor 14 upon passing through part of the lens 5 on that side of the half-mirror 13 facing the light source 1.

For the sake of simplicity, the arrangement shown in FIG. 3 is such that the light reflected by the half-mirror 13 first passes through the single lens 5 on the light-source side of the half-mirror 13 and then reaches the exposure sensor 14 upon passing through an opticals unit 31 which inputs the light to the exposure sensor 14. However, if a number of lenses is desirable in terms of design, it is permissible to use any number of the lenses 5, provided on the light-source side of the half-mirror 13, traversed by the light reflected from half-mirror 13.

In order to establish a correlation between the amount of exposure at the position where this is measured and the amount of exposure of the substrate 11, it will suffice to follow a procedure similar to that of the prior art, namely to move the exposure sensor 15 mounted on the stage 12 into the illuminated area, perform trial exposure at a position substantially the same as a predetermined position in the illuminated area of the substrate 11 and compare the trial output with the output obtained when the amount of exposure of the substrate is measured.

In a case where the amount of exposure at the position where this is measured and the amount of exposure at a predetermined position in the illuminated area of the substrate 11 have been correlated, the amount of exposure at the substrate 11 will be represented by the amount of exposure at a single predetermined position in the illuminated area of the substrate. In other words, control is not carried out so as to obtain a desired amount of exposure over the entirety of the illuminated area. However, since a substantially uniform illuminance distribution is produced in the illuminated area in a projection exposure apparatus, the amount of exposure can be controlled with satisfactory precision over the entirety of the illuminated area even though the amount of exposure is represented by that at the single predetermined position in the illuminated area.

As mentioned above, a projection exposure apparatus is so designed that a substantially uniform illuminance distribution is obtained in the illuminated area. If the amount of exposure is controlled based upon the determined relationship between the correlated amounts of exposure in such a manner that the amount of exposure at the position where this is measured will attain a value that corresponds to the optimum amount of exposure at the correlated point on substrate 11, the amount of exposure can be controlled with satisfactory precision over the entirety of the illuminated area. In actuality, however, there is some slight unevenness in illuminance in the illuminated area. The amount of exposure can be controlled much more precisely, therefore, by controlling it upon taking into account not only the relationship between the amount of exposure at the exposure measurement position and the amount of exposure at the predetermined position on substrate 11, which have been correlated by the method described above, but also the illuminance unevenness in the illuminated area.

Figure 5:
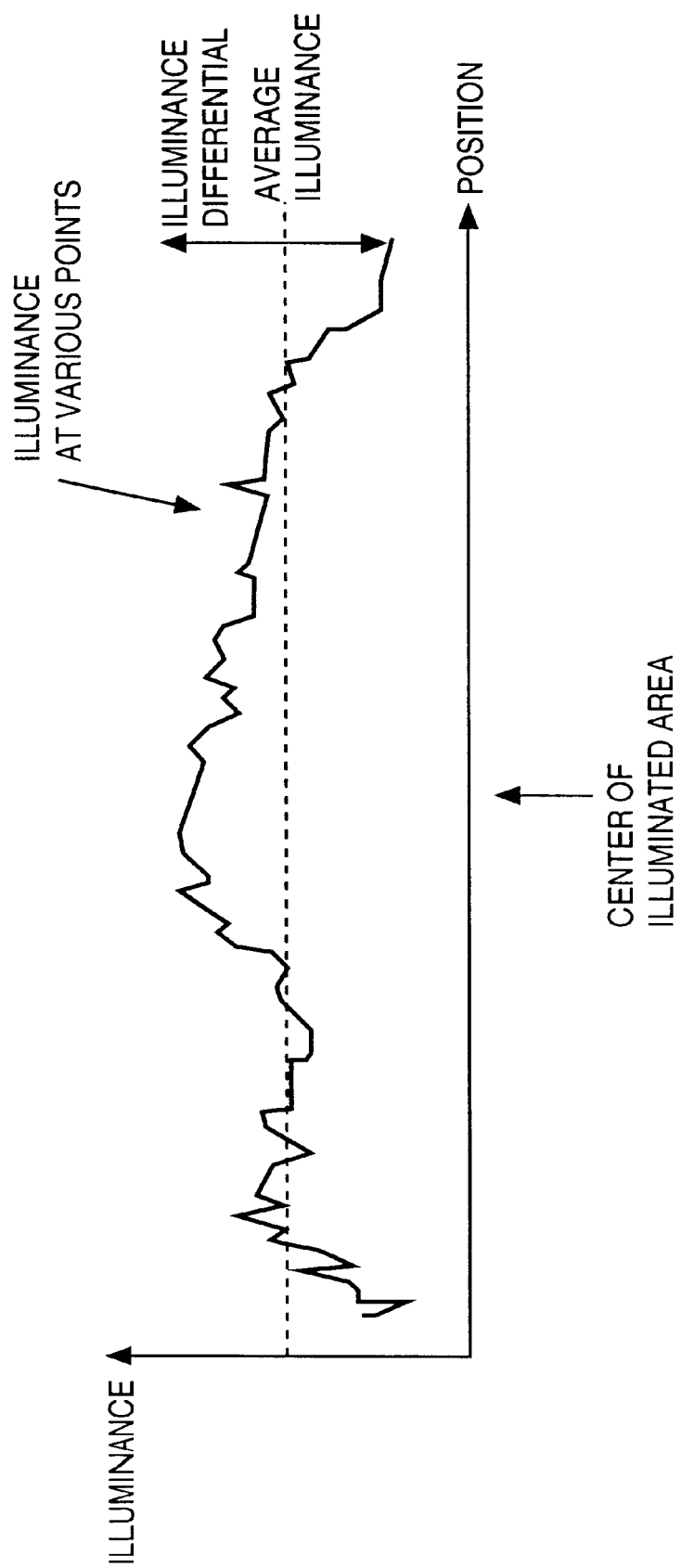
FIG. 5 is a graph schematically representing illuminance at various points on a line passing through the center of an illuminated area on a substrate.

FIG. 5 schematically illustrates illuminance at various points on a line passing through the center of an illuminated area. It will be understood that when amount of exposure at the center of the illuminated area and amount of exposure at the exposure measurement position are correlated and exposure is carried out in such a manner that the center of the illuminated area receives the proper amount of exposure, the center of the illuminated area does receive the proper amount of exposure but the edges of the illuminated area are not exposed adequately. Accordingly, by taking such irregular illuminance into consideration and performing control of amount of exposure in such a manner that the proper amount of exposure will be obtained in a case where the entire illuminated area indicated by the dashed line is exposed with average illuminance, the substrate 11 can be exposed with an amount of exposure near the proper amount over the entirety of the exposed area.

Figure 7:
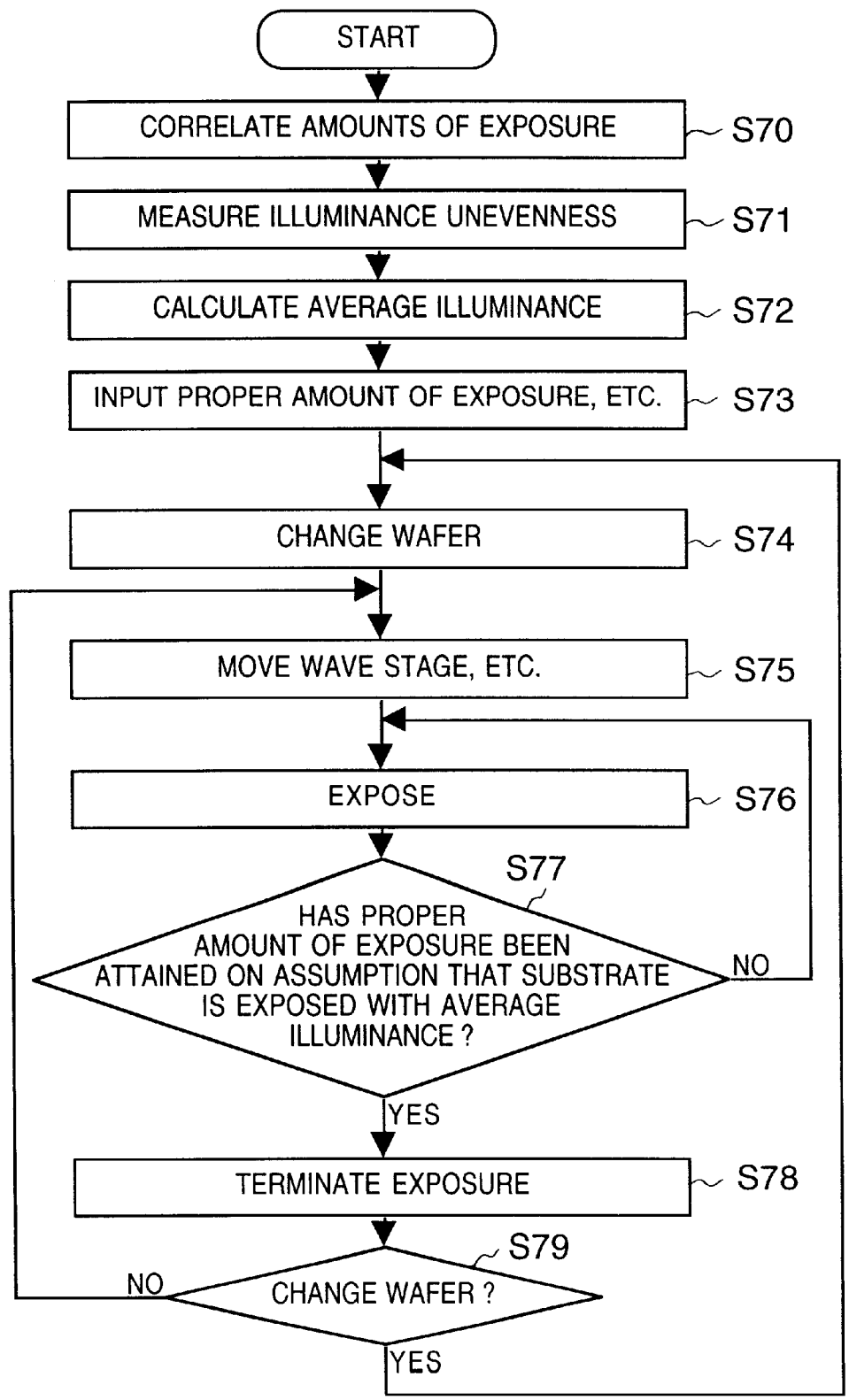
FIG. 7 is a flowchart illustrating an exposure control method in the apparatus of FIG. 1.
Figure 8:
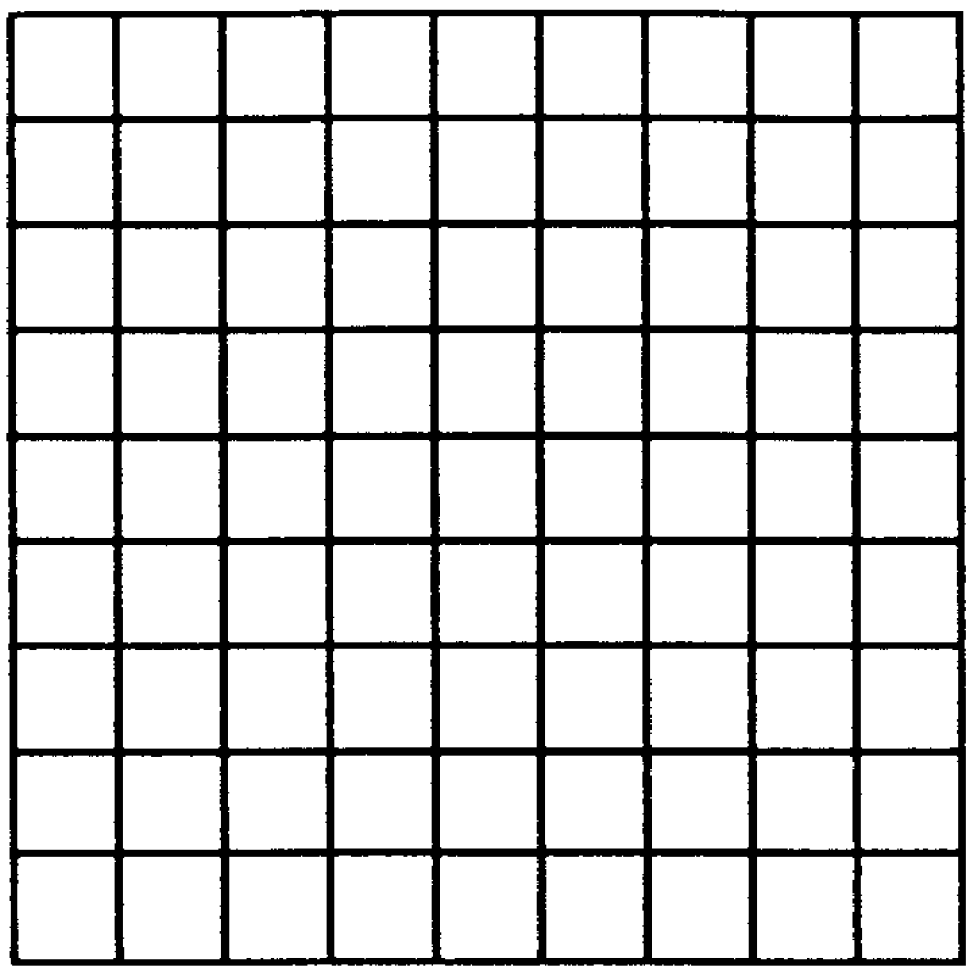
FIG. 8 is a diagram showing grid points on a substrate subjected to trial exposure in the apparatus of FIG. 1.

FIG. 7 is a flowchart illustrating an exposure control method for thus performing exposure so as to obtain the proper amount of exposure in a case where the entire illuminated area is exposed with average illuminance while taking illuminance unevenness in the illuminated area into consideration. When control of amount of exposure starts, first the exposure sensor 15 on stage 12 is moved to the center of the illuminated area, trial exposure is performed and the amount of exposure at the position where this is measured and the amount of exposure on the surface of the wafer (substrate) 11 are correlated (step 70). Next, the exposure sensor 15 is moved step by step to each of the grid points (see FIG. 8) in the illuminated area, trial exposure is performed at each of these grid points and illuminance unevenness in the illuminated area is measured (step 71). Next, average illuminance in the illuminated area is calculated from the measured illuminance at each grid point (step 72). Information necessary for exposure such as the proper amount of exposure is then input (step 73). Wafer exchange (transport of wafers to and from the wafer stage 12) and, if necessary, reticle exchange, is performed (step 74). Final preparations for exposure such as alignment and leveling of the wafer 11 is then carried out (step 75). This is followed by performing exposure (step 76). In order to control the amount of exposure in such a manner that the amount of exposure of the substrate 11 will be the proper amount on the assumption that the substrate is being exposed with average illuminance, it is determined whether the proper amount of exposure has been attained (step 77). Exposure continues (step 76) if the proper amount of exposure has not yet been attained and is ended (step 78) if the proper amount of exposure has been attained.

More specifically, let Dp represent the proper amount of exposure, Ic the illuminance at the center of the illuminated area, Ia the average illuminance, Dm the amount of exposure at the position where amount of exposure is measured, and Dc the amount of exposure at the center of the illuminated area. Since illuminance is the amount of exposure per unit time, it will suffice to perform control of amount of exposure in such a manner that the amount of exposure at the position where this is measured will be Dp·(Dm/Dc)·(Ic/Ia).

Next, it is determined whether the wafer should be changed (step 79). If exposure of the wafer 11 currently placed on the wafer stage 12 has been completed, the wafer is changed (step 74). If exposure of wafer 11 has not been completed, the wafer stage 12 is moved (step 75) and exposure is performed at the next exposure position in the same manner.

Another example of controlling amount of exposure upon taking illuminance unevenness into account is as follows: In a case where the pattern on the mask 8 requires a high resolution in a certain area but does not require it in another area, it necessary that the area requiring the high resolution have its amount of exposure controlled with higher precision. Accordingly, on the basis of the illuminance at a representative point on the substrate 11 that has been correlated with the amount of exposure at the exposure measurement position and further on the basis of the ratio between the illuminance of the representative point, and the illuminance of the area requiring the high resolution, which is predicted from the illuminance unevenness, the amount of exposure at the position of measurement is measured and the amount of exposure is controlled in such a manner that the amount of exposure in the area requiring the high resolution will become the proper amount of exposure. This makes it possible to improve the yield of the operation.

Figure 9:
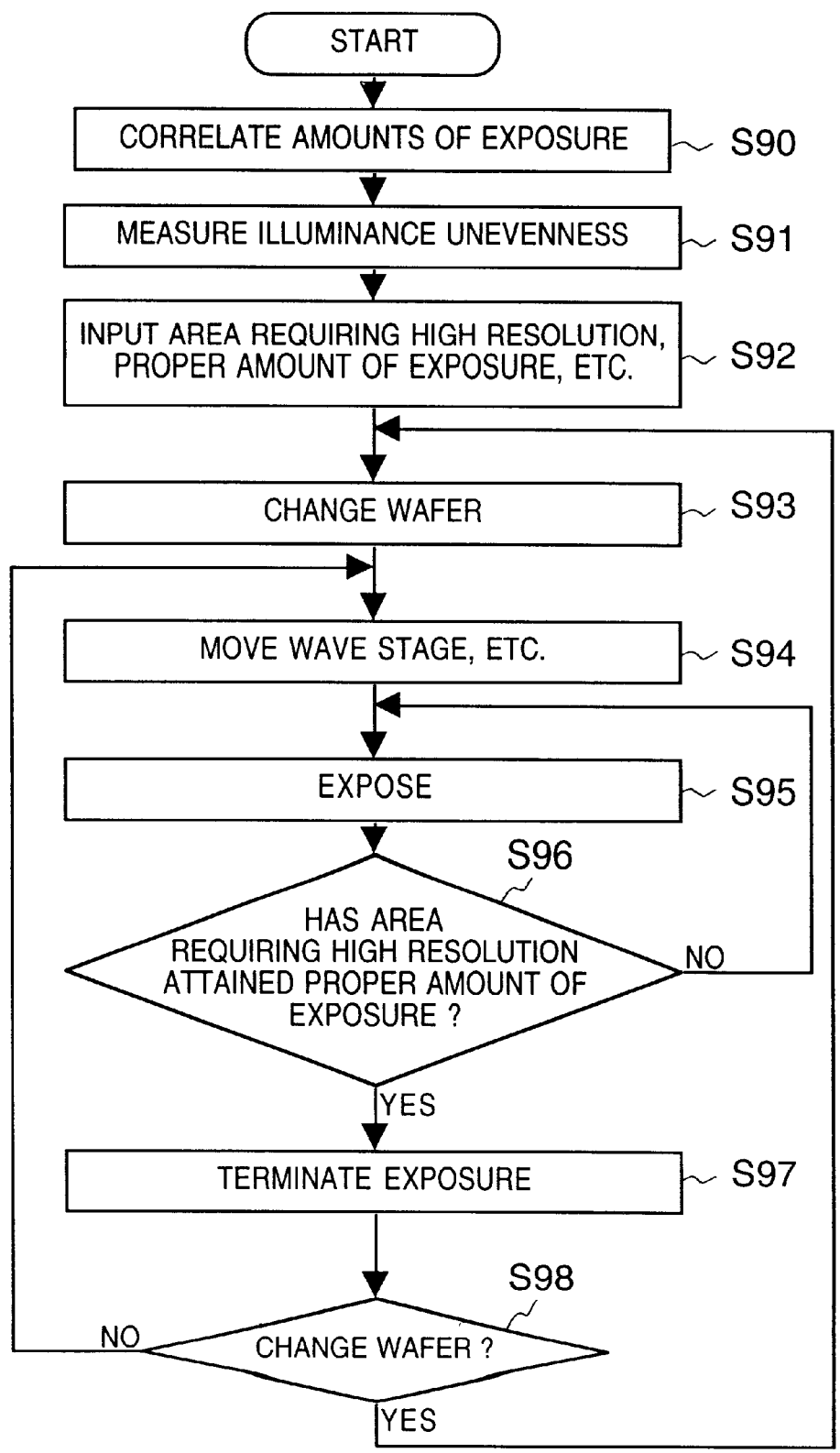
FIG. 9 is a flowchart illustrating another exposure control method in the apparatus of FIG. 1.

FIG. 9 is a flowchart illustrating an example of an exposure control method for thus performing exposure while taking illuminance unevenness in the illuminated area into consideration in such a manner the amount of exposure in an area requiring a high resolution will become the proper amount of exposure. When control of amount of exposure starts in this case, first the exposure sensor 15 on stage 12 is moved to the center of the illuminated area, trial exposure is performed and the amount of exposure at the position where this is measured and the amount of exposure on the surface of the wafer (substrate) 11 are correlated (step 90). Next, the exposure sensor 15 is moved step by step to each of the grid points (see FIG. 8) in the illuminated area, trial exposure is performed at each of these grid points and illuminance unevenness in the illuminated area is measured (step 91). Information necessary for exposure such as the area in the reticle pattern requiring high resolution and the proper amount of exposure is then input (step 92). Wafer exchange (transport of wafers to and from the wafer stage 12) and, if necessary, reticle exchange, is performed (step 93). Final preparations for exposure such as alignment and leveling of the wafer 11 is then carried out (step 94). This is followed by performing exposure (step 95). In order to control the amount of exposure in such a manner that the amount of exposure in the area requiring the high resolution will be the proper amount, it is determined whether the proper amount of exposure has been attained (step 96). Exposure continues (step 95) if the proper amount of exposure has not yet been attained and is ended (step 97) if the proper amount of exposure has been attained.

More specifically, let Dp represent the proper amount of exposure, Ic the illuminance at the center of the illuminated area, Ih the illuminance of the area requiring the high resolution, Dm the amount of exposure at the position where amount of exposure is measured, and Dc the amount of exposure at the center of the illuminated area. Since illuminance is the amount of exposure per unit time, it will suffice to perform control of amount of exposure in such a manner that the amount of exposure at the position where this is measured will be $Dp \cdot (Dm/Dc) \cdot (Ic/Ih)$.

Next, it is determined whether the wafer should be changed (step 98). If exposure of the wafer 11 currently placed on the wafer stage 12 has been completed, the wafer is changed (step 93). If exposure of wafer 11 has not been completed, the wafer stage 12 is moved (step 94) and exposure is performed at the next exposure position in the same manner.

In the flowcharts of FIGS. 7 and 9, the correlation of amounts of exposure and the measurement of illuminance unevenness are carried out separately. However, an arrangement may be adopted in which when the illuminance unevenness is measured, the illuminance in the illuminated area on the optical axis and the illuminance at the position where the amount of exposure is measured may be compared to thereby correlate the amounts of exposure. Further, measurement of illuminance unevenness may be performed by measuring illuminance at a suitable pitch in the illuminated area. Thus, it is not particularly necessary to measure illuminance at each grid point shown in FIG. 8.

In a case where the projection exposure apparatus is of the scanning type, the method of measuring amount of exposure is the same. The only difference is the program for controlling the amount of exposure. In the scanning-type projection exposure apparatus, the program is for step-and-repeat projection exposure. Accordingly, if the exposure control program for a scanning-type projection exposure apparatus is used, the present invention can be applied to control of amount of exposure in a scanning-type projection exposure apparatus.

The reason why the exposure control program for a scanning-type projection exposure apparatus differs from that for a step-and-repeat projection exposure apparatus is as follows: In a step-and-repeat projection exposure apparatus, the amount of exposure is controlled by controlling the opening and closing of the shutter 17, the transmittance of the beam attenuating means 18 the transmittance of which is variable, and the input to the light source 1. In the scanning-type projection exposure apparatus, on the other hand, the mask 8 and substrate 11 are scanned synchronously, whereby the entirety of the exposure area is exposed while moving the illuminated area, which is part of the exposure area. This means that exposure cannot be completed until the scanning of the mask 8 and substrate 11 has been completed in regard to the entire exposure area. Consequently, control of amount of exposure by opening and closing the shutter 17 cannot be achieved.

The amount of exposure in a scanning-type projection exposure apparatus is decided by $s \times I/v$, where s represents the length of the illuminated area in the scanning direction, I the illuminance and v the scanning speed. Accordingly, in order to control amount of exposure in a scanning-type projection exposure apparatus, it is necessary to control at least the length s of the illuminated area in the scanning direction, the illuminance I or the scanning speed v.

Figure 6:
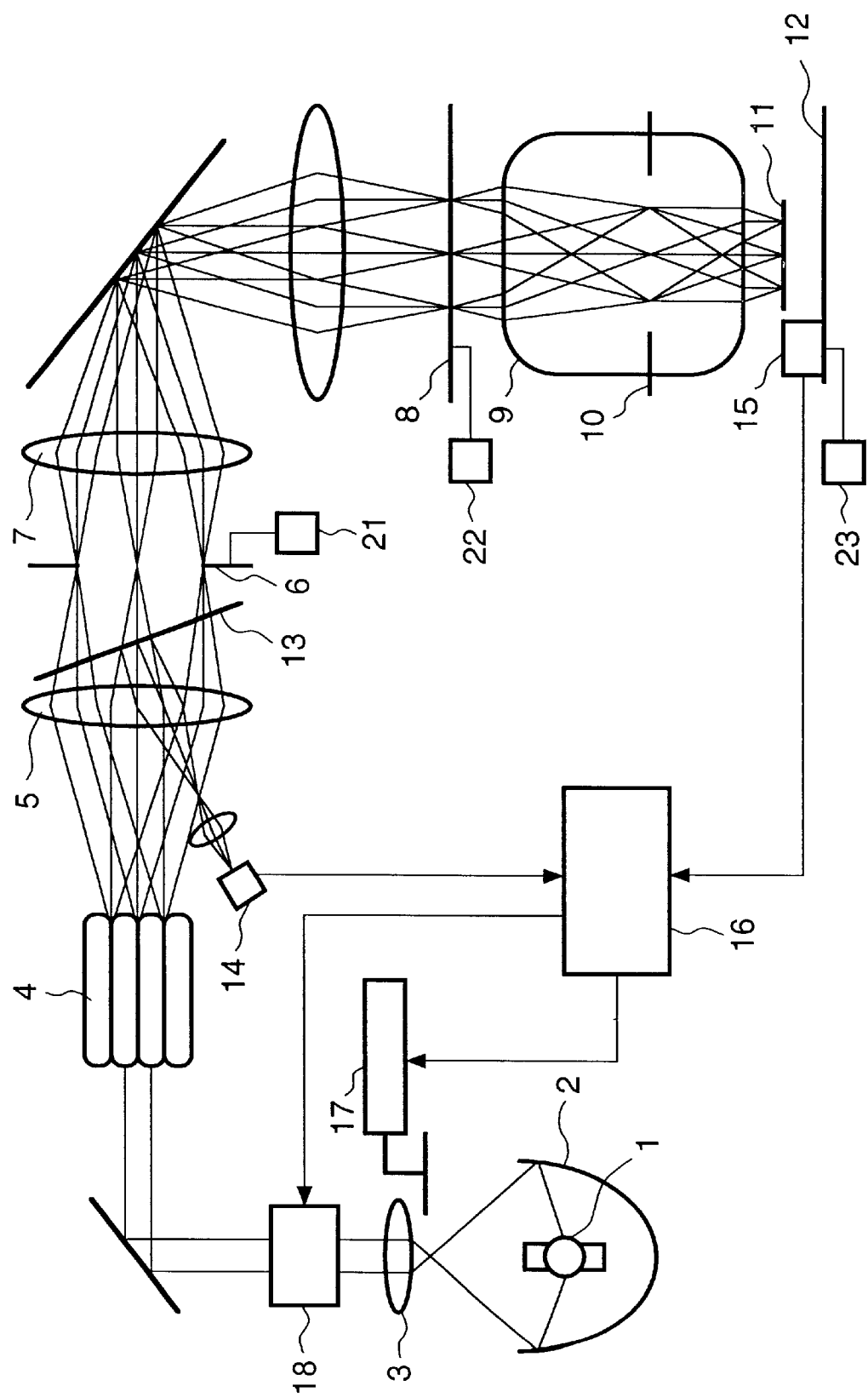
FIG. 6 is a diagram showing a scanning-type projection exposure apparatus according to a second embodiment of the present invention.

FIG. 6 illustrates a scanning-type projection exposure apparatus according to a second embodiment of the present invention. This apparatus differs from the step-and-repeat projection exposure apparatus of FIG. 1 in that it is additionally provided with drive units 21, 22 and 23 for driving the diaphragm 6, which limits the illuminated area, the mask 8 and the wafer 11, respectively. In order to control the length s of the illuminated area in the scanning direction for the purpose of controlling the amount of exposure, it will suffice to control the length of the aperture by moving the diaphragm 6. In order to control illuminance I for the purpose of controlling the amount of exposure, it will suffice to control either the power introduced to the light source 1 or the transmittance of the beam attenuating unit 18 provided in the optical path. Examples of the beam attenuating unit 18 are a beam attenuator having optical members of different transmittances disposed on a turret so that transmittance may be varied by selecting these optical members, or a beam attenuator in which transmittance is varied by changing the angle of a mirror the transmittance whereof differs depending upon the angle formed with the optical axis. Further, in order to control the scanning speed v, it will suffice to control the driving speeds of the drive units 21, 22 and 23.

The present invention is characterized in that light which reaches an exposure sensor for measuring amount of exposure in order to control the amount of exposure during exposure does not arrive at the sensor directly from a half-mirror but after first passing through part of an opticals unit on the light-source side of the half-mirror. If the technique is such that a program for controlling amount of exposure carries out control based upon an output from this exposure sensor, then this technique and all such similar techniques fall within the scope of the present invention.

Embodiment of Device Manufacturing Method

Described next will be an embodiment of a process for producing a semiconductor device utilizing the exposure apparatus set forth above.

Figure 10:
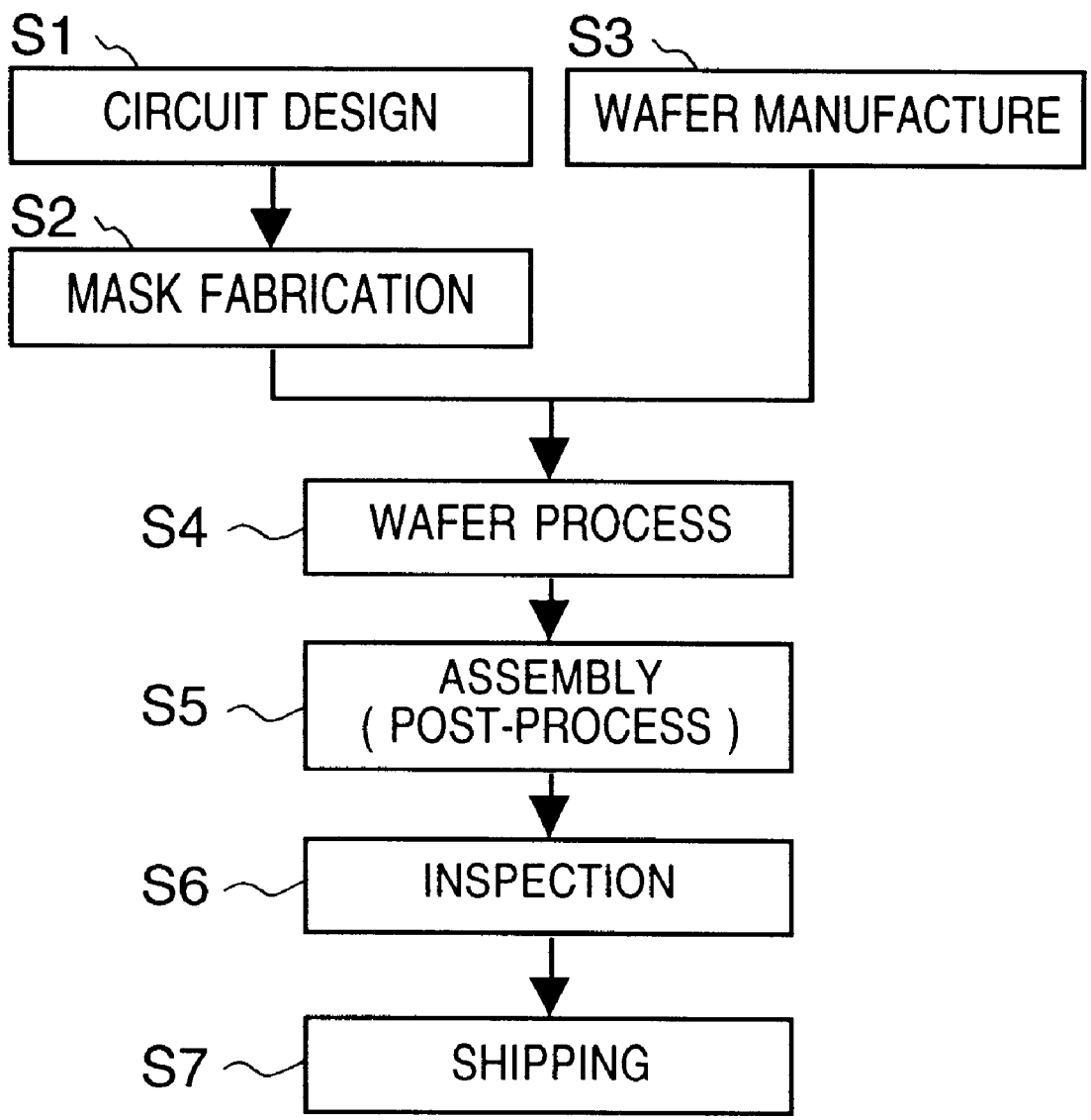
FIG. 10 is a flowchart illustrating a device manufacturing method capable of utilizing the exposure apparatus according to the present invention.

FIG. 10 illustrates the flow of manufacture of a semiconductor device (a semiconductor chip such as an IC or LSI chip, a liquid crystal panel, a CCD, a thin-film magnetic head, a micromachine, etc.). The circuit for the semiconductor device is designed at step 1 (circuit design). A mask on which the designed circuit pattern has been formed is fabricated at step 2 (mask fabrication). A wafer is manufactured using a material such as silicon or glass at step 3 (wafer manufacture). The actual circuit is formed on the wafer by lithography, using the mask and wafer that have been prepared, at step 4 (wafer process), which is also referred to as a "pre-process". A semiconductor chip is obtained, using the wafer fabricated at step 4, at step 5 (assembly), which is also referred to as a "post-process". This step includes steps such as actual assembly (dicing and bonding) and packaging (chip encapsulation). The semiconductor device fabricated at step 5 is subjected to inspections such as an operation verification test and durability test at step 6 (inspection). The semiconductor device is completed through these steps and then is shipped (step 7).

Figure 11:
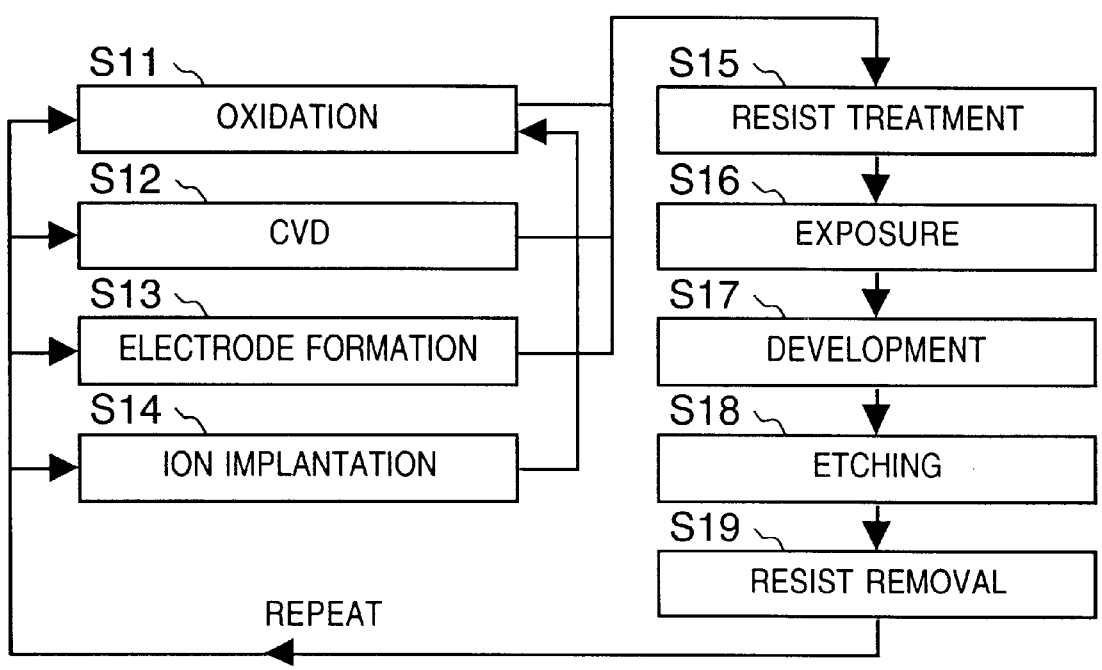
FIG. 11 is a flowchart showing the details of a wafer process depicted in FIG. 10.

FIG. 11 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described projection exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly.

If the production process of this embodiment is employed, semiconductor devices having a high degree of integration can be manufactured at low cost. Manufacture of such semiconductor devices using the prior-art techniques was difficult.

Thus, in accordance with the present invention, as described above, the position of a half-mirror is set in such a manner that an optical path, to which light is diverted for the purpose of measuring amount of exposure necessary for controlling the amount of exposure, passes through part of an optical element disposed on the light-source side of the half-mirror. The amount of exposure is measured on this optical path following its passage through the optical element. As a result, the distance between the half-mirror and the optical element can be reduced. This makes it possible to diminish the space for exposure measurement that is necessary to control the amount of exposure.

As many apparently widely different embodiments of the present invention can be made without departing from the spirit and scope thereof, it is to be understood that the invention is not limited to the specific embodiments thereof except as defined in the appended claims.

What is claimed is:

1. A method of controlling amount of exposure in which when a pattern on a reticle is illuminated by illuminating light from a light source so as to be projected onto a substrate to expose the same, the illuminating light is diverted by a half-mirror, the amount of exposure is measured on the optical path of the diverted illuminating light and the amount of exposure of the substrate is controlled based upon result of such measurement, the method including the steps of:

setting the position of the half-mirror in such a manner that the optical path of the diverted illuminating light passes through part of an optical element situated on a side of the half-mirror that faces the light source; and measuring the amount of exposure on the optical path of the diverted illuminating light following its passage through the optical element.

2. The method according to claim 1, further comprising a step of performing control for rendering the amount of exposure of the substrate while taking into account a relationship, which has been found in advance, between a measured value of amount of exposure on the optical path of the diverted illuminating light and the amount of exposure of the substrate.

3. The method according to claim 1, further comprising the steps of:

finding a relationship between an amount of exposure on the optical path of the diverted illuminating light and amount of exposure of the substrate at a predetermined position on the substrate before the substrate is exposed; and performing control of the amount of exposure of the substrate while taking into account said relationship and unevenness in illuminance in an illuminated area on the substrate when the substrate is exposed.

4. An exposure apparatus comprising:

projection exposure means for illuminating a pattern on a reticle by illuminating light from a light source so as to project the pattern onto a substrate to expose the same;

exposure measurement means for measuring amount of exposure on an optical path to which the illuminating light has been diverted by a half-mirror; and exposure control means for controlling amount of exposure of the substrate based upon result of such measurement;

wherein the position of the half-mirror is set in such a manner that the optical path of the diverted illuminating light passes through part of an optical element situated on a side of the half-mirror that faces the light source;

said exposure measurement means measures the amount of exposure on the optical path of the diverted illuminating light following its passage through the optical element; and said exposure control means finds a relationship between an amount of exposure on the optical path of the diverted illuminating light and amount of exposure of the substrate at a predetermined position on the substrate before the substrate is exposed, and performs control of the amount of exposure of the substrate while taking into account said relationship and unevenness in illuminance in an illuminated area on the substrate when the substrate is exposed.

5. The apparatus according to claim 4, wherein said projection exposure means is scanning-type projection exposure means which, while part of the reticle pattern is being projected onto the substrate, scans the reticle and the substrate synchronously to thereby scanningly project the reticle pattern onto the substrate.

6. A device manufacturing method for manufacturing a device by illuminating a pattern on a reticle by illuminating light so as to project the pattern onto a substrate to expose the same, wherein when exposure by projection of the illuminating light is performed, the illuminating light is diverted by a half-mirror, the amount of exposure is measured on the optical path of the diverted illuminating light and the amount of exposure of the substrate is controlled based upon result of measurement, the method comprising steps of:

setting the position of the half-mirror in such a manner that the optical path of the diverted illuminating light passes through part of an optical element situated on a side of the half-mirror that faces the light source and measuring the amount of exposure on the optical path of the diverted illuminating light following its passage through the optical element; and finding a relationship between an amount of exposure on the optical path of the diverted illuminating light and amount of exposure of the substrate at a predetermined position on the substrate before the substrate is exposed, and performing control of the amount of exposure of the substrate while taking into account said relationship and unevenness in illuminance in an illuminated area on the substrate when the substrate is exposed.

* * * * *